United States Patent [19]
Hazama

[11] Patent Number: 5,780,890
[45] Date of Patent: Jul. 14, 1998

[54] NONVOLATILE SEMICONDUCTOR MEMORY DEVICE AND A METHOD OF WRITING DATA IN THE SAME

[75] Inventor: Katsuki Hazama, Tokyo, Japan

[73] Assignee: Nippon Steel Corporation, Tokyo, Japan

[21] Appl. No.: 576,691

[22] Filed: Dec. 21, 1995

[30] Foreign Application Priority Data

Dec. 26, 1994 [JP] Japan ..................... 6-337221
Dec. 26, 1994 [JP] Japan ..................... 6-337222

[51] Int. Cl.$^6$ ............................ G11C 16/02; G11C 16/04
[52] U.S. Cl. ................ 257/316; 365/185.11; 365/185.18
[58] Field of Search ..................... 257/316, 314; 365/185.11, 185.18, 185.26

[56] References Cited

U.S. PATENT DOCUMENTS

| | | | |
|---|---|---|---|
| 5,517,448 | 5/1996 | Liu | 365/185.11 |
| 5,604,698 | 2/1997 | Bergemont | 365/185.01 |
| 5,615,152 | 3/1997 | Bergemont | 365/185.18 |
| 5,633,822 | 5/1997 | Campardo et al. | 365/185.02 |

OTHER PUBLICATIONS

Kume et al., A 1.28um$^2$ Contactless Memory Cell Technology for a 3V–Only 64 Mbit EEPROM, IEDM 92, pp. 991–993, 1992, IEEE.

NOR Virtual Ground (NVG)–A New Scaling Concept for Very High Density Flash EEPROM, IEDM 93, pp. 15–18, 1993 IEEE.

NIKKEI Micro Devices, Dec. 1993, pp. 128–129.

*Primary Examiner*—Donald Monin
*Attorney, Agent, or Firm*—Pollock, Vande Sande & Priddy

[57] ABSTRACT

A nonvolatile semiconductor memory device includes an array of a plurality of memory cells formed in a semiconductor substrate and arranged in a matrix of columns and rows, word lines each being formed to include control gates of the memory cells arranged in each row, a plurality of bit lines, each being connected to drains of the memory cells arranged in one column, and a plurality of source lines, each being connected to sources of the memory cells arranged in one column; wherein adjacent two memory cells arranged in each row have the source or drain in common; and each of the plurality of bit lines is connected selectively to one of adjacent two main bit or source lines through a switching circuit. Further, a method of writing data in a nonvolatile semiconductor memory device of the above-mentioned type includes the steps of applying a first voltage to the control gate of a first memory cell to be written, a second voltage to the drain thereof and a third voltage lower than the second voltage to the source; applying the second voltage to the source of a second memory cell having its drain in common with the first memory cell; and applying a fourth voltage lower than the second voltage and higher than the third voltage to the drain of a third memory cell having its source in common with the second memory cell and to the source of a fourth memory cell having its drain in common with the third memory cell.

15 Claims, 15 Drawing Sheets

NONVOLATILE SEMICONDUCTOR MEMORY DEVICE AND A METHOD OF WRITING DATA IN THE SAME

BACKGROUND OF THE INVENTION

1. Field of the Invention

The present invention relates to a nonvolatile semiconductor memory device and a method of writing in the same, and more particularly to a nonvolatile semiconductor memory device such as a flash type Electrically Erasable and Programmable Read Only Memory (EEPROM) and a method of writing data in the same.

2. Description of the Related Art

An EEPROM is capable of writing and erasing electrically, and is nonvolatile such that data are not erased even when the power is shut off. In particular, a flash type EEPROM (referred to as a "flash memory") in which data are erased with all bits collectively or in the unit of block is utilized in various fields, and a product having a larger memory capacity is desired.

What is called a "contactless system" such as disclosed in "A 1.28 μm$^2$ Contactless memory cell Technology for a 3V-Only 64 Mbit EEPROM", by Kume et al.: IEDM 92, pp. 991–993: 1992 IEEE has been proposed as one of the systems for achieving higher integration and higher capacity of this flash memory. According to this contactless system, in an array of memory cells which are arranged in a matrix of columns and rows, source/drain diffusion layers of a plurality of memory cells of the respective columns are formed continuously in a substrate so that the memory size can be made smaller by omitting the drain contact for each memory cell that has been required so far in a NOR type cell array of this sort. In the system stated in this document, however, a pair of source diffusion layer and drain diffusion layers have been required for the memory cells in each column.

On the other hand, in order to achieve high integration of memory cells in a read only memory such as a mask ROM, what is called a "virtual ground system" has been proposed NIKKEI Microdevice, December, 1993 pp. 128–129, in which the source/drain diffusion layers of respective memory cells are structured as described above so that they also serve as source/bit line as they are, and each diffusion layer is used in common by a pair of memory cells disposed adjacent to each other in a direction along a word line extending in a row direction, and hence only one source/drain diffusion layer is sufficient for the memory cells in each column or in a direction of bit line.

This virtual ground system is also proposed for a flash memory as disclosed in "NOR Virtual Ground (NVG)-A New Scaling Concept for Very High Density FLASH EEPROM and its Implementation in a 0.5 μm process": IEDM 92, pp. 15–18: 1993 IEEE. The virtual ground system in the flash memory disclosed in this document will be described hereinafter.

FIG. 15 is a partial equivalent circuit diagram of a memory cell array of a conventional flash memory according to a virtual ground system.

The write operation in the flash memory shown in FIG. 15 will be described.

For example, when data are written in the memory cell M(3,6), the word line $W_2$ is biased at 12 V, other word lines at 0 V, the bit line $B_3$ at 6 V, the bit line $B_4$ at a floating state (an open state), other bit lines at 0 V, the source line $S_3$ at 6 V, the source line $S_4$ at a floating state, and other source lines at 0 V, respectively. As a result, 12 V is applied to the control gate of the memory cell M(3,6), 6 V to the drain thereof and 0 V to the source thereof, respectively, hot electrons are injected into the floating gate of the memory cell M(3,6), and this memory cell M(3,6) is brought into a written state.

Now, erroneous writing in a memory cell M(3,7) adjacent to the memory cell M(3,6) on the right side across the bit line $B_3$ is prevented. Further, erroneous writing in a further rightward memory cell M(3,8) in which 6 V is applied to the source is prevented by holding the bit line $B_4$ at a floating state.

In a conventional method of writing in a flash memory which is arranged according to the above-mentioned virtual ground system, however, when data are written in the memory cell M(3,6) for instance, 12 V is applied to the control gate and 0 V is applied to the drain, respectively, and the source is at a floating state in a fourth adjacent memory cell M(3,10). These conditions are considered to readily cause a memory cell in which data is not to be written to be subjected to data writing because of a Fowler-Nordheim (FN) tunnelling phenomenon due to a potential difference between the floating gate and the drain thereof. Namely, in the conventional method of writing described above, there has been such a problem that, when writing is performed in a certain memory cell, there is a high possibility that erroneous writing is caused in other memory cells.

SUMMARY OF THE INVENTION

It is a first object of the present invention to provide a nonvolatile semiconductor memory device using a virtual ground system in particular which is highly reliable so that at the time of a data writing operation in a selected memory cell, erroneous writing is not made in other memory cells, and a method of writing data in the same.

In order to achieve the above-mentioned object, a nonvolatile semiconductor memory device according to a first aspect of the invention includes a semiconductor substrate. A plurality of memory cells is formed on the semiconductor substrate and arranged in a matrix of columns and rows. Each memory cell has a source, a drain and a composite gate structure including a floating gate and a control gate, wherein adjacent two memory cells arranged in each row have a common impurity diffusion layer which serves as the sources or drains thereof. Word lines, each including the control gates of the memory cells, are arranged in one of the rows. A plurality of bit lines and a plurality of source lines are disposed alternately in the row direction. Each bit line includes a continuous layer formed in the substrate, through which the impurity diffusion layers serving as drains of the memory cells arranged in one column are continuously connected. Each source line includes a continuous layer formed in the substrate, through which the impurity diffusion layers serving as sources of the memory cells arranged in one column are continuously connected. Selective connection means are provided for connecting each bit line selectively to one of the adjacent two source lines.

According to a second aspect of the present invention, a nonvolatile semiconductor memory device includes a semiconductor substrate. An array of memory cells is formed on said semiconductor substrate and disposed in a matrix of columns and rows. Each memory cell has a source, a drain and a composite gate structure including a floating gate and a control gate, in which adjacent two memory cells arranged in each row have a common impurity diffusion layer serving as the sources or drains thereof. The memory cell array is divided into a plurality of blocks in a direction of the column such that each of the blocks includes 2n (n is a positive integer) memory cells in each column. Word lines, each being arranged to include the control gates of said memory cells, are arranged in one of the rows. A plurality of sub-bit lines is provided in each of the blocks, each sub-bit line including a continuous layer formed in said substrate, through which the impurity diffusion layers serving as the drains of the memory cells arranged in the column direction of the block are continuously connected. Also, a plurality of sub-source lines is formed so as to extend over two adjacent blocks. Each sub-source line includes a continuous layer formed in the substrate, through which the impurity diffusion layers serving as the sources of 2n memory cells arranged in the column direction of the two adjacent blocks are continuously connected, wherein the plurality of sub-bit lines and the plurality of source lines are arranged alternately in each block. A plurality of main bit lines is formed along the columns. Switching means are provided for selectively connecting each of the plurality of sub-bit lines provided in each block to at least one of the plurality of main bit lines through a bit contact formed in the block.

A method of writing data in a nonvolatile semiconductor memory device according to a first aspect of the present invention is provided. The nonvolatile semiconductor memory device includes an array of a plurality of memory cells formed on a semiconductor substrate and arranged in a matrix of columns and rows. Each memory cell having a source, a drain and a composite gate structure including a floating gate and a control gate, in which two adjacent memory cells arranged in each row have a common impurity diffusion layer serving as the sources or the drains thereof. Word lines, each being arranged to include the control gates of the memory cells, arranged in one of the rows. A plurality of bit lines and a plurality of source lines are disposed alternately in the row direction. Each bit line includes a continuous layer formed in the substrate, through which the impurity diffusion layers serving as the drains of the memory cells arranged in one column are continuously connected. Each source line includes a continuous layer formed in said substrate, through which the impurity diffusion layers serving as sources of the memory cells arranged in one column are continuously connected. The method includes applying a first voltage to the control gate of a first one of the memory cells to be written, a second voltage to its drain, and a third voltage lower than the second voltage to its source, thereby injecting hot carriers into a floating gate of the first memory cell. The second voltage is also applied to the source of a second one of the memory cells having its drain in common with the first memory cell. A fourth voltage lower than the second voltage and higher than the third voltage is applied to the drain of a third one of the memory cells having its source in common with the second memory cell and to a source of a fourth one of the memory cells having its drain in common with the third memory cell.

A method of writing data in a nonvolatile semiconductor memory device of a type described above according to a second aspect of the present invention includes applying a first voltage to the control gate of a first one of the memory cells to be written, a second voltage to its drain, and a third voltage lower than the second voltage to its source, thereby injecting hot carriers in to the floating gate of the first memory cell. A fourth voltage lower than the second voltage and higher than the third voltage is applied to the source of a second one of the memory cells having its drain in common with the first memory cell.

A method of writing data in a nonvolatile semiconductor memory device of a type described above according to a third aspect of the present invention includes applying a first voltage to the control gate of a first one of the memory cells to be written, a second voltage to its drain and a third voltage lower than the second voltage to its source, thereby injecting hot carriers into the floating gate of the first memory cell. The source of a second one of the memory cells having the drain in common with the first memory cell is placed at an open-circuit state.

The present invention relates to a nonvolatile semiconductor memory device of a virtual ground system, and it is possible to arrange, so that, when predetermined data are written in a first memory cell, adjacent memory cells arranged in the same row as the first memory cell are not written in erroneously by the method of the present invention.

Further, the nonvolatile semiconductor memory device according to a first aspect of the present invention has a structure that facilitates voltage application to control gates, drains and sources of respective memory cells by the above-mentioned method.

Furthermore, in the nonvolatile semiconductor memory device according to the second aspect of the present invention, the sub-bit lines formed of drain diffusion layers in a substrate are provided separately in the respective blocks. The high voltage is applied only to the sub-bit line of the block to which the memory cell to be written belongs, thereby greatly reducing the number of memory cells of which the drains are applied with high voltage. Accordingly, the number of memory cells that have a possibility of being subjected to erroneous erasing at time of writing in a certain memory cell is reduced and the reliability of the device is improved. When the device is structured so as to detect erroneous erasing of other memory cells at the time of writing, the number of memory cells needed for detection of erroneous erasing is reduced, thus shortening the time required for detection.

DESCRIPTION OF THE PREFERRED EMBODIMENTS

Figure 1:
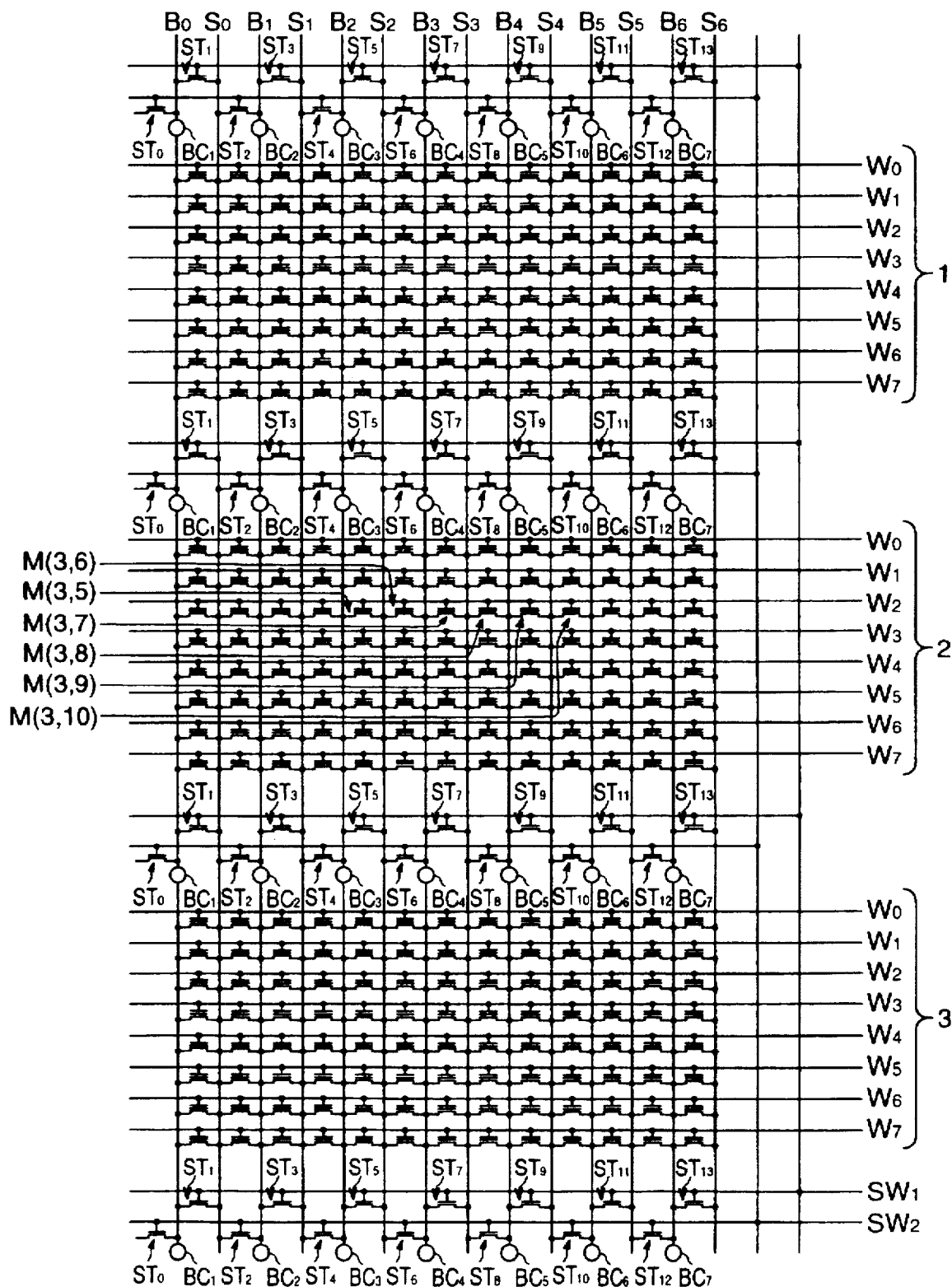
FIG. 1 is an equivalent electrical circuit diagram showing a structure of a memory cell array of a flash memory according to a first embodiment of the present invention.

A flash memory of a virtual ground system according to a first embodiment of the present invention will be described with reference to FIG. 1. FIG. 1 shows an equivalent circuit of a part of a memory cell array of a flash memory. In FIG. 1, three memory cell blocks (hereinafter referred to simply as blocks) are illustrated. 8 in each column×13 in each row=104 memory cells are included in each block, and each memory cell is generally represented by M(p,q). Here, p is an integer in a range of 1 to 8, and q is an integer in a range of 1 to 13. In a memory cell array, a plurality of such blocks are arranged in each a column and row direction. Each memory cell M(p,q) is a non-volatile memory cell having a source and a drain that are a pair of spaced impurity diffusion layers formed in a surface of a semiconductor substrate. A floating gate is formed on the semiconductor substrate at an area disposed between the impurity diffusion layers through an insulating film, and a control gate is formed on the floating gate through an insulating film.

Each of eight word lines $W_0$ to $W_7$ is obtained by forming continuously the control gates of the memory cells M(p,q) of one of the rows of each block. Further, each of the memory cells M(p,q) has a source or drain in common with another memory cell adjacent thereto in the row direction (the word line direction). For example, the memory cell M(3,6) disposed at the center of the diagram has the drain in common with a memory cell M(3,7) on the right side thereof and a source in common with the memory cell M(3,5) disposed on the left side thereof.

Eight word lines $W_0$ to $W_7$, seven bit lines $B_0$ to $B_6$ and seven source lines $S_0$ to $S_6$ are connected in each of the blocks 1, 2 and 3. Further, each of the word lines $W_0$ to $W_7$ of each of the blocks 1, 2 and 3 is connected to the gates of 13 memory cells M(1,1) to M(1,13), M(2,1) to M(2,13), . . . . , or M(8,1) to M(8,13). Further, the bit lines $B_0$ to $B_6$ and source lines $S_0$ to $S_6$ are obtained by forming continuously the drain diffusion layers and the source diffusion layers of the memory cells arranged in a direction at a right angle with the word lines $W_0$ to $W_7$ (the column direction) in the substrate, respectively. Further, the plurality of bit lines $B_0$ to $B_6$ and the plurality of source lines $S_0$ to $S_6$ are arranged alternately in the row direction in the memory cell array.

Further, selective transistors ST0, ST1, . . . ST13 are provided to each of the blocks 1, 2 and 3. In each block, the sources and drains of the transistors ST1, ST3, . . . ST13 are connected to the adjacent bit and source lines B0, S0; B1, S1; B2, S2; . . . B6, S6, respectively and the gates of the transistors ST1, ST3, . . . ST13 are connected to a selective word line SW1 common to all the blocks. On the other hand, in each block, the sources and drains of the transistors ST2, ST4, . . . ST12 are connected to the adjacent bit and source lines B1, S0; B2, S1; B3, S2; . . . B6, S5; respectively, and the drain and source of the transistor ST0 are connected to the bit line B0 and the source line S6 in the adjacent block (not shown). The gates of the transistors ST0, ST2, ST4, . . . ST12 are connected to a selective word line SW2 common to all the blocks.

Bit contacts $BC_1$ to $BC_7$ are provided in each block for connecting the bit lines $B_0$ to $B_6$ formed in the substrate with main bit lines (not shown) formed of a metal, such as aluminum on the substrate through an insulating film. Additionally, each of the source lines $S_0$ to $S_6$ is at a floating state (an open-circuit state).

Figure 2:
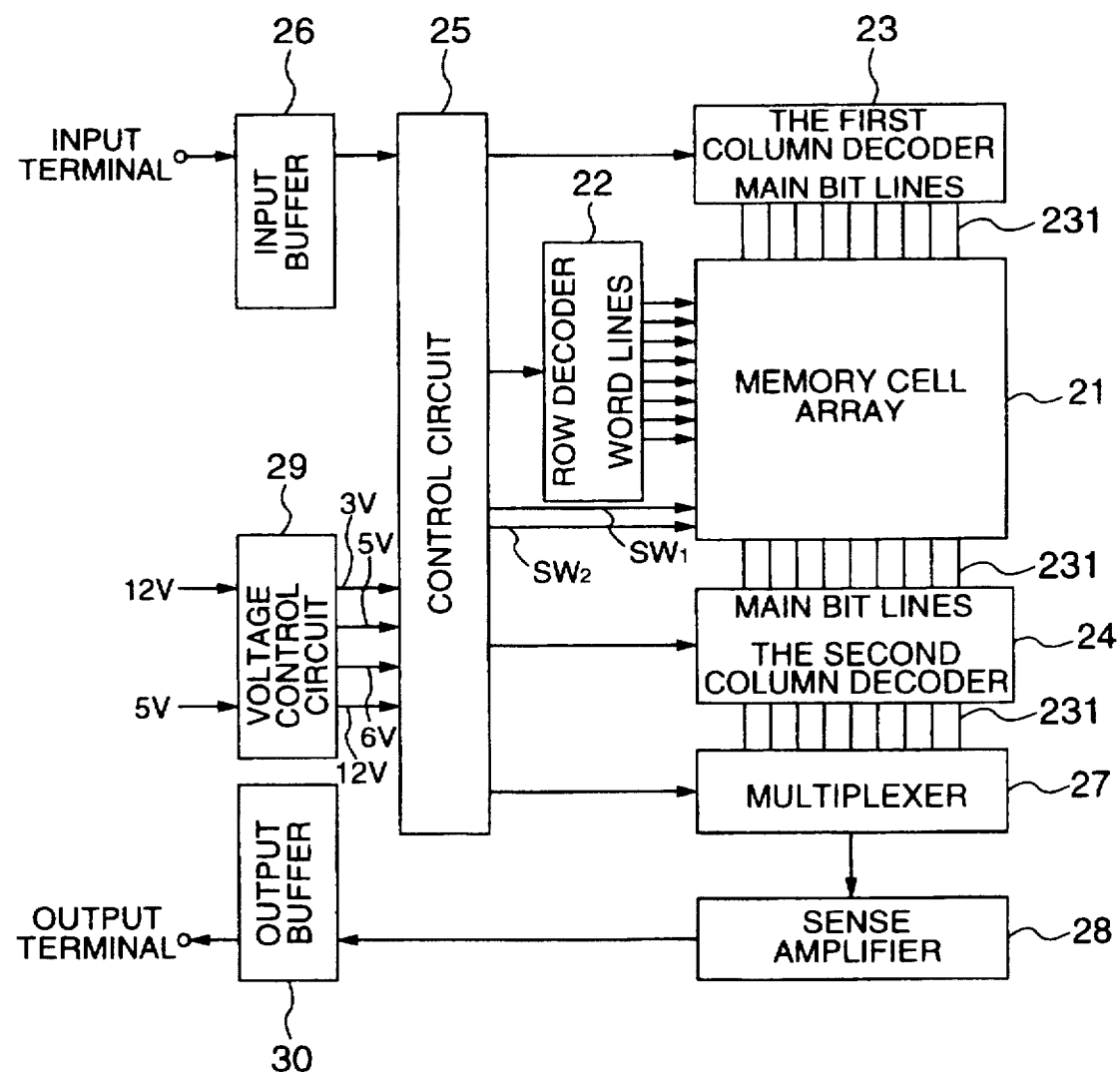
FIG. 2 is a block diagram showing a structure of the flash memory shown in FIG. 1.

FIG. 2 is a block diagram showing a circuit structure of the flash memory shown in FIG. 1. In FIG. 2, a memory cell array 21 has a plurality of memory cells arranged in a matrix as shown in FIG. 1. Word lines $W_0$ to $W_7$ provided in each block of the memory cell array 21 are connected to a row decoder 22, respectively, and one of the word lines is selected by a signal from a control circuit 25. Main bit lines 231 of the memory cell array 21 are connected to a first column decoder 23 and a second column decoder 24 shown on the opposite sides of the memory cell array 21. The control circuit 25 transmits instructions for rewriting and reading data, including signals showing a bit line and a word line selected based on an address of the memory cell to be rewritten or read out to the row decoder 22, the selective word lines $SW_1$ and $SW_2$, the first column decoder 23 and the second column decoder 24, respectively, in accordance with the contents of an address signal that has been sent from an input terminal IN through an input buffer circuit 26.

A voltage control circuit 29 is supplied with 12 V (voltage boosted from power supply voltage 5 V) and 5 V (power supply voltage) from the outside, respectively, and generates voltage of 3 V and 6 V inside thereof. Voltages of 3 V, 5 V, 6 V and 12 V are supplied to the row decoder 22, the selective word lines $SW_1$ and $SW_2$, the first column decoder 23 and the second column decoder 24 from the voltage control circuit 29 through the control circuit 25, respectively. Further, the row decoder 22 applies a voltage of 0 V, 5 V or 12 V, the first column decoder 23 applies a voltage of 0 V or 6 V, and the second column decoder 24 applies a voltage of 0 V or 3 V to the control gates, drains and sources of respective memory cells in accordance with the operations of rewriting or reading of data. The reason why two column decoders 23 and 24 are used as described above is that it is difficult to supply two different voltages of 3 V and 6 V to a group of bit lines at the same time by means of one column decoder. A multiplexer 27 connected to the second column decoder 24 selects any of the signals from the second column decoder 24 in accordance with an instruction from the control circuit 25, and outputs the selected signal toward a sense amplifier 28 connected to the source line. A signal amplified in the sense amplifier 28 is outputted from an output terminal OUT through an output buffer circuit 30.

Figure 3:
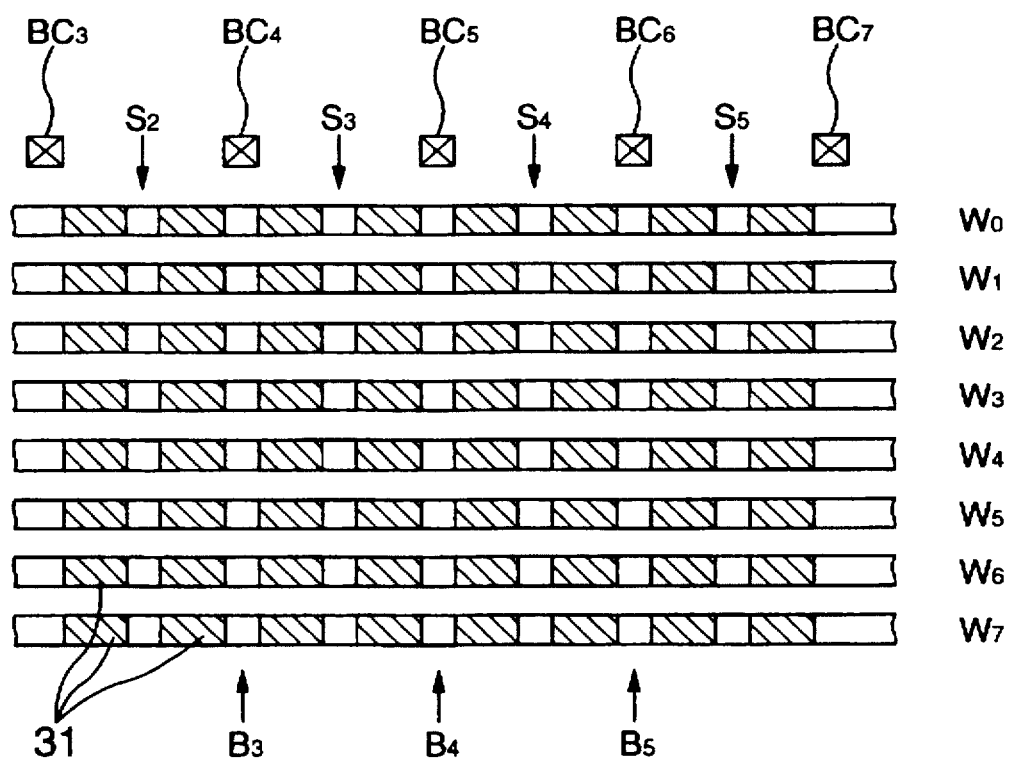
FIG. 3 is a plan view of the memory cell array shown in FIG. 1.

FIG. 3 is a partial plan view showing the outline of the memory cell array shown in FIG. 1. FIG. 3 shows 64 memory cells M(1,5) to M(1,12), M(2,5) to M(2,12), . . . . , and M(8,5) to M(8,12) of one block among the memory cell array shown in FIG. 1. The control gates of the memory cells M(1,5) to M(1,12); . . . . , or M(8,5) to M(8,12) in each row are formed integrally with one of the word lines $W_0$, . . . . $W_7$, and eight floating gates 31 are formed under each of the word lines $W_0$, . . . $W_7$ correspondingly to respective memory cells in each row. Further, the bit lines $B_3$ to $B_5$ and the source lines $S_2$ to $S_5$ extending in a direction at a right angle with the word lines are formed alternately at locations between the floating gates 31 of adjacent memory cells inside the silicon substrate. In the memory cell of the present embodiment, the minimum dimension per one memory cell in the word line direction is determined by the pitch of aluminum wirings, for instance, that are the main bit lines connected to the bit lines through bit contacts BCs, and the minimum dimension per one memory cell in the bit line direction is also determined by the pitch of the word lines $W_0, \ldots, W_7$ that are control gates, thus making it possible to form the individual memory cells very small.

FIGS. 4A to 4G are sectional views taken along the word line direction of the memory cell of the steps, in sequence, of a method of manufacturing memory cells of the flash memory type shown in FIG. 1.

Figure 4A:
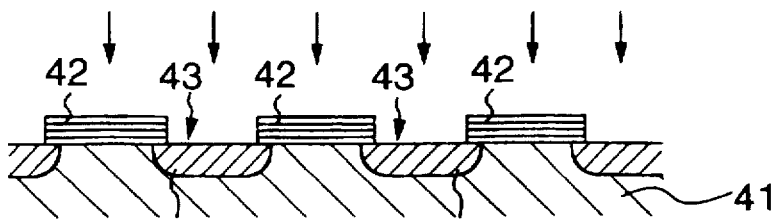
FIGS. 4A to 4G are sectional views for explaining the steps in sequence of a method of manufacturing the memory cell array shown in FIG. 1.

First, as shown in FIG. 4A, a silicon nitride film 42 is formed on the whole surface of a P-type silicon substrate 41, and thereafter the silicon nitride film 42 is removed selectively by etching using micro-lithography using photoresist (not shown), so that the silicon nitride film 42 remains only in regions where memory cells are to be formed, thereby forming openings 43 in the silicon nitride film 42. Thereafter, boron (B) and phosphorus (P) are ion-implanted into the silicon substrate 41 by using the silicon nitride film 42 and a patterned photoresist (not shown) as a mask so that $N^-$ diffusion layers 44 and $P^+$ diffusion layers 45 are formed alternately in the silicon substrate 41 at the bottoms of the openings 43.

Figure 4B:
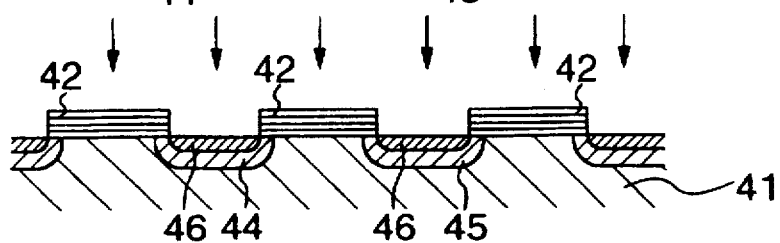

Next, as shown in FIG. 4B, arsenic (As) is ion-implanted into the silicon substrate 41 by using the silicon nitride film 42 as a mask, thereby forming $N^+$ diffusion layers 46 enclosed in the $N^-$ diffusion layer 44 and the $P^+$ diffusion layer 45, respectively.

Figure 4C:
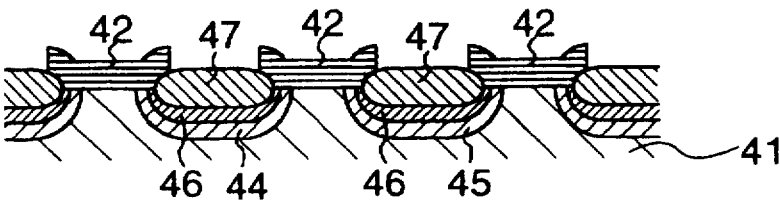

Next, as shown in FIG. 4C, the silicon substrate 41 is thermally oxidized by a LOCOS method by using the silicon nitride film 42 as a mask, thereby forming field oxide films 47.

Figure 4D:
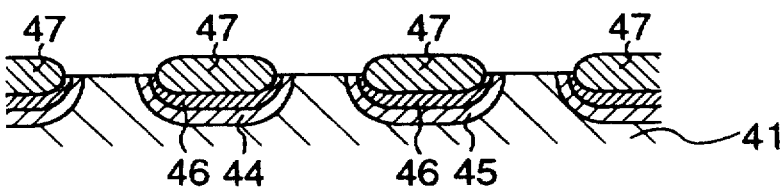

Next, as shown in FIG. 4D, the silicon nitride film 42 is removed.

Figure 4E:
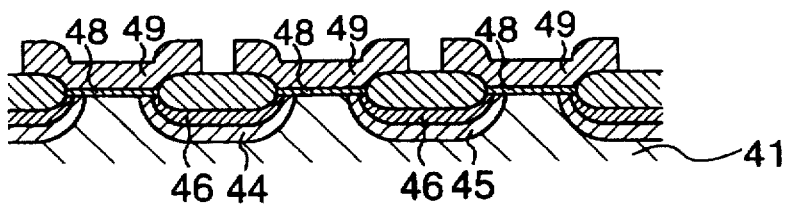

Next, as shown in FIG. 4E, a polycrystalline silicon film is formed on the whole surface of the silicon substrate 41 after a tunnel oxide film 48 is formed. Then, the polycrystalline silicon film is removed selectively by etching by micro-lithography using photoresist (not shown), thereby forming floating gates 49.

Figure 4F:
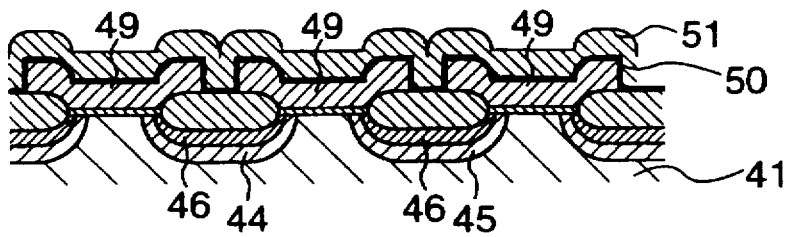

Next, as shown in FIG. 4F, an ONO film 50, composed of a silicon oxide film, a silicon nitride film and a silicon oxide film, is formed on the whole surface and a polycrystalline silicon film is formed on the whole surface thereafter. Then, the polycrystalline silicon film is removed selectively by etching by micro-lithography using photoresist (not shown), thereby forming control gates 51 serving as a word line.

Figure 4G:
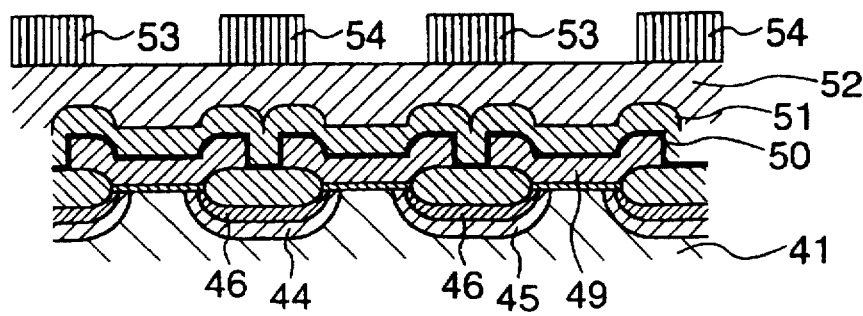

Next, as shown in FIG. 4G, after an interlayer insulator 52 is formed on the whole surface, main bit lines 53 and main source lines 54 are formed of aluminum on the substrate so as to be connected with $N^+$ diffusion layers 46 through contact holes (not shown) opened at predetermined positions of the interlayer insulator 52. The memory cell array shown in FIG. 1 is manufactured by the steps described above.

In the memory cell as shown in FIGS. 4A to 4G, the $N^+$ diffusion layers 46 enclosed in the $N^-$ diffusion layers 44 form the source lines in the substrate, and the $N^+$ diffusion layers 46 enclosed in the $P^+$ diffusion layers 45 form the bit lines in the substrate. Accordingly, the junction dielectric strength is higher at the source lines in the substrate due to the existence of the $N^-$ diffusion layers 44, and the generation efficiency of channel hot electrons is also improved at the bit lines in the substrate due to the existence of the $P^+$ diffusion layers 45 so that it is possible to make higher the rate of the writing operation.

Next, the write operation of the flash memory shown in FIG. 1 will be described with reference to FIG. 5 and FIG. 6.

Figure 5:
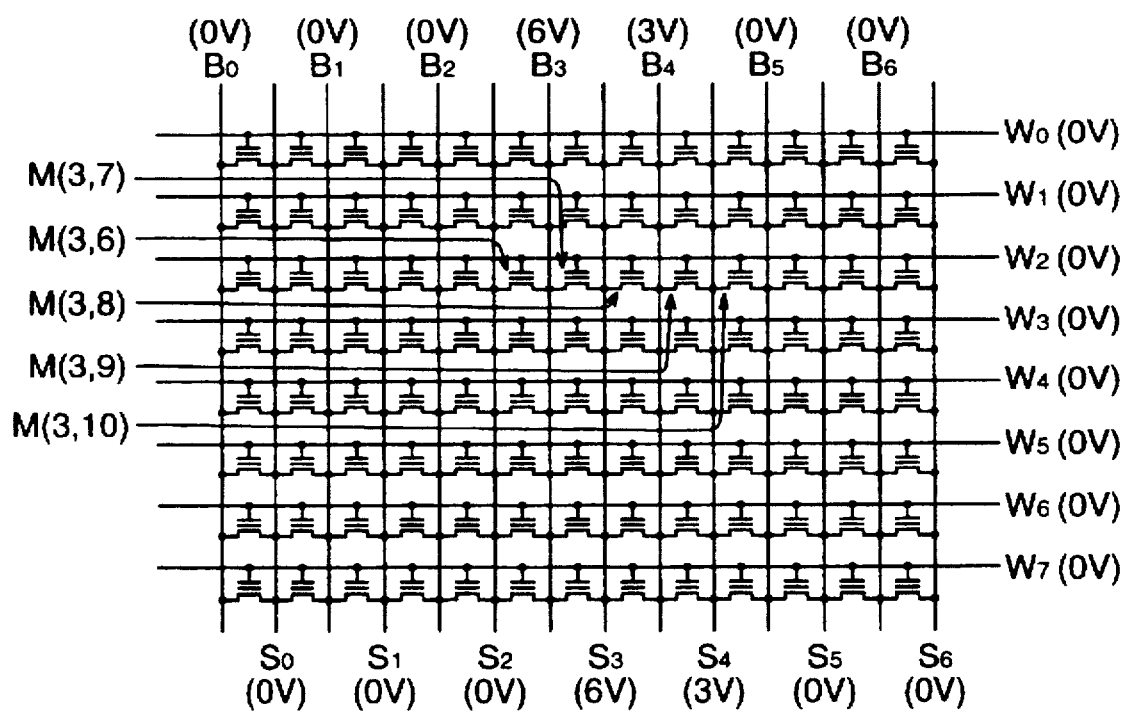
FIG. 5 is a diagram for explaining an example of the voltages applied to the memory cell array in FIG. 1 in a method of writing data according to the present invention.

First, for example, when data are written in the memory cell M(3,6) of the block 2, the word line $W_2$ of the block 2 is biased at 12 V, other word lines at 0 V, the main bit line connected to the bit line $B_3$ at 6 V, the main bit line connected to the bit line $B_4$ at 3 V, other main bit lines at 0 V, the selective word line $SW_1$ at 5 V and the selective word line $SW_2$ at 0 V, respectively, as shown in FIG. 1 and FIG. 5. Thus, selective transistors $ST_1, ST_3, ST_5, ST_7, ST_9, ST_{11}$, and $ST_{13}$ shown in FIG. 1 are turned ON, respectively, and the bit line $B_0$ and the source line $S_0$, the bit line $B_1$ and the source line $S_1$, and the bit line $B_6$ and the source line $S_6$ conduct to each other at the same potential. As a result, 12 V is applied to the control gate of the memory cell M(3,6) of the block 2, 6 V to the drain thereof and 0 V to the source thereof, respectively, and hot electrons are injected into the floating gate of the memory cell M(3,6), and this memory cell M(3,6) is brought into a written state.

Since 6 V is applied to the source line $S_3$ at this time as shown in FIG. 5, 6 V is applied to the source and the drain of the memory cell M(3,7) adjacent to the memory cell M(3,6) across the bit line $B_3$, so that erroneous writing does not occur in the memory cell M(3,7). Further, since 3 V is applied to the bit line $B_4$, erroneous writing does not occur in the memory cell M(3,8) of which the source is at 6 V.

Furthermore, since 3 V is applied to the source line $S_4$, 3 V is applied to the source and the drain of the memory cell M(3,9) adjacent to the memory cell M(3,8) across the bit line $B_4$, respectively, so that erroneous writing does not occur in the memory cell M(3,9). Furthermore, 3 V is applied to the source and 0 V is applied to the drain, respectively, in the memory cell M(3,10) adjacent to the memory cell M(3,6) across the source line $S_4$, and hence no erroneous writing occurs in the memory cell M(3,10).

Additionally, the potential of 3 V applied to the bit line $B_4$ and the source line $S_4$ can be altered appropriately within a range of 0 V to 6 V so that electric charges are not injected into any of the floating gates of the memory cell M(3,8) and the memory cell M(3,10) by either hot electron injection or FN tunnelling phenomena.

Figure 6:
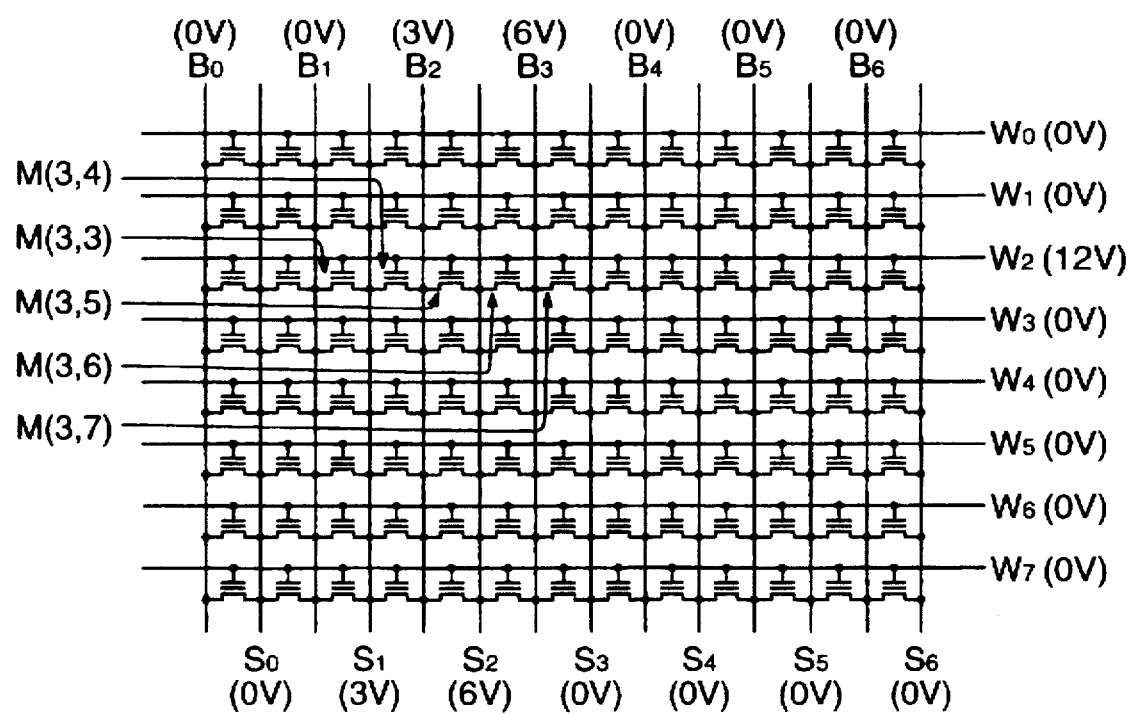
FIG. 6 is a diagram for explaining another example of the voltages applied to the memory cell array in FIG. 1 in a method of writing data according to the present invention.

Next, for example, when data are written in the memory cell M(3,7) of the block 2, the word line $W_2$ of the block 2 is biased at 12 V, other word lines at 0 V, the main bit line connected to the bit line $B_3$ at 6 V, the main bit line connected to the bit line $B_2$ at 3 V, other main bit lines at 0 V, the selective word line $SW_1$ at 0 V and the selective word line $SW_2$ at 5 V, respectively, as shown in FIG. 1 and FIG. 6. Thus, the selective transistors $ST_0, ST_2, ST_4, ST_6, ST_8, ST_{10}$ and $ST_{12}$ shown in FIG. 1 are turned ON, respectively, and the bit line $B_1$ and the source line $S_0$, the bit line $B_2$ and the source line $S_1, \ldots$, and the bit line $B_6$ and the source line $S_5$ become conductive to each other, respectively, at the same potential. Further, the source line $S_6$ is controlled at 0 V through the selective transistor $ST_0$, of an adjacent block by means of the bit line $B_0$ of that block. As a result, 12 V is applied to the control gate of the memory cell M(3,7) of the block 2, 6 V to the drain thereof and 0 V to the source thereof, respectively, so that hot electrons are injected into the floating gate of the memory cell M(3,7), and this memory cell M(3,7) is brought into a written state.

Since 6 V is applied to the source line $S_2$ at this time as shown in FIG. 6, 6 V is applied to the source and the drain of the memory cell M(3,6) adjacent to the memory cell M(3,7) across the bit line $B_3$, respectively, so that erroneous writing does not occur in the memory cell M(3,6). Further, since 3 V is applied to the bit line $B_2$, erroneous writing does not occur in the memory cell M(3,5) which has its source at 6 V.

Furthermore, since 3 V is applied to the source line $S_1$, 3 V is applied to the source and the drain of the memory cell M(3,4) adjacent to the memory cell M(3,5) across the bit line $B_2$, so that no erroneous writing occurs in the memory cell M(3,4). Furthermore, 3 V is applied to the source and 0 V is applied to the drain of the memory cell M(3,3) adjacent to this memory cell M(3,4) across the source line $S_1$, respectively, and no erroneous writing occurs in the memory cell M(3,3).

Next, the reading operation of the flash memory shown in FIG. 1 will be described. For example, when data are read out of the memory cell M(3,6) of the block 2, the word line $W_2$ of the block 2 is biased at 5 V, other word lines at 0 V, the main bit line connected to the bit line $B_3$ at 3 V, other main bit lines at 0 V, the selective word line $SW_1$ at 5 V and the selective word line $SW_2$ at 0 V, respectively. Thus, the selective transistors $ST_1$, $ST_3$, $ST_5$, $ST_7$, $ST_9$, $ST_{11}$, and $ST_{13}$ are turned ON, respectively, and the bit line $B_3$ and the source line $S_3$ are at 3 V, respectively, and other bit lines and source lines are all at 0 V at the same time. As a result, 5 V is applied to the control gate of the memory cell M(3,6) of the block 2, 3 V is applied to the drain thereof and 0 V is applied to the source thereof, respectively. At this time, whether the memory cell M(3,6) is in a written state or in an erased state is determined, depending on whether an electric current flows in the bit line $B_3$ or not.

Next, the erasing operation of the flash memory shown in FIG. 1 will be described. In the present example, the storage contents of all memory cells in the memory cell array are erased collectively. For this purpose, the word lines $W_0$ to $W_7$ of all the blocks are biased at −12 V. As a result, electrons are extracted from the floating gate of the memory cell in a written state by an FN tunnelling phenomenon, and the data that have been written in the memory cell are erased. It is also possible to erase only the memory cell connected to a certain word line by biasing only that word line at −12 V.

The first embodiment of the present invention has been described above, but, in the above-mentioned flash memory of the virtual ground system, one bit line is connected to a large number of memory cells arranged in each column. Therefore, when data are written in the memory cell M(3,6) of the block 2 for instance, 0 V is applied to the control gates, 0 V to the sources and 0 V to the drains with respect to a large number of memory cells, such as memory cells M(1,6) and M(2,6) of all blocks connected to the sub-bit line $B_3$. These conditions may readily cause the memory cells in which data have been written to be subjected to erasing of data because of the Fowler-Nordheim (FN) tunnelling phenomenon due to the potential difference between the floating gate and the drain. Namely, in the flash memory of the virtual ground system as described above, there is such a problem that there is a high possibility that erroneous erasing occurs in other memory cells at the time of writing.

Further, for example, when it is intended to improve the reliability of a device by detecting erroneous erasing after writing data in the memory cell M(3,6) of the block 2, there is a problem that it is required to perform an erroneous erasing detecting operation with respect to the memory cells of all the blocks connected to the bit line $B_3$, and a long time is required for detecting the erroneous erasing.

The nonvolatile semiconductor memory device according to a second embodiment of the present invention is structured so that the number of memory cells connected to one bit line is reduced in order to solve the above-mentioned problems. The second embodiment of the present invention will be described with reference to FIG. 7.

Figure 7:
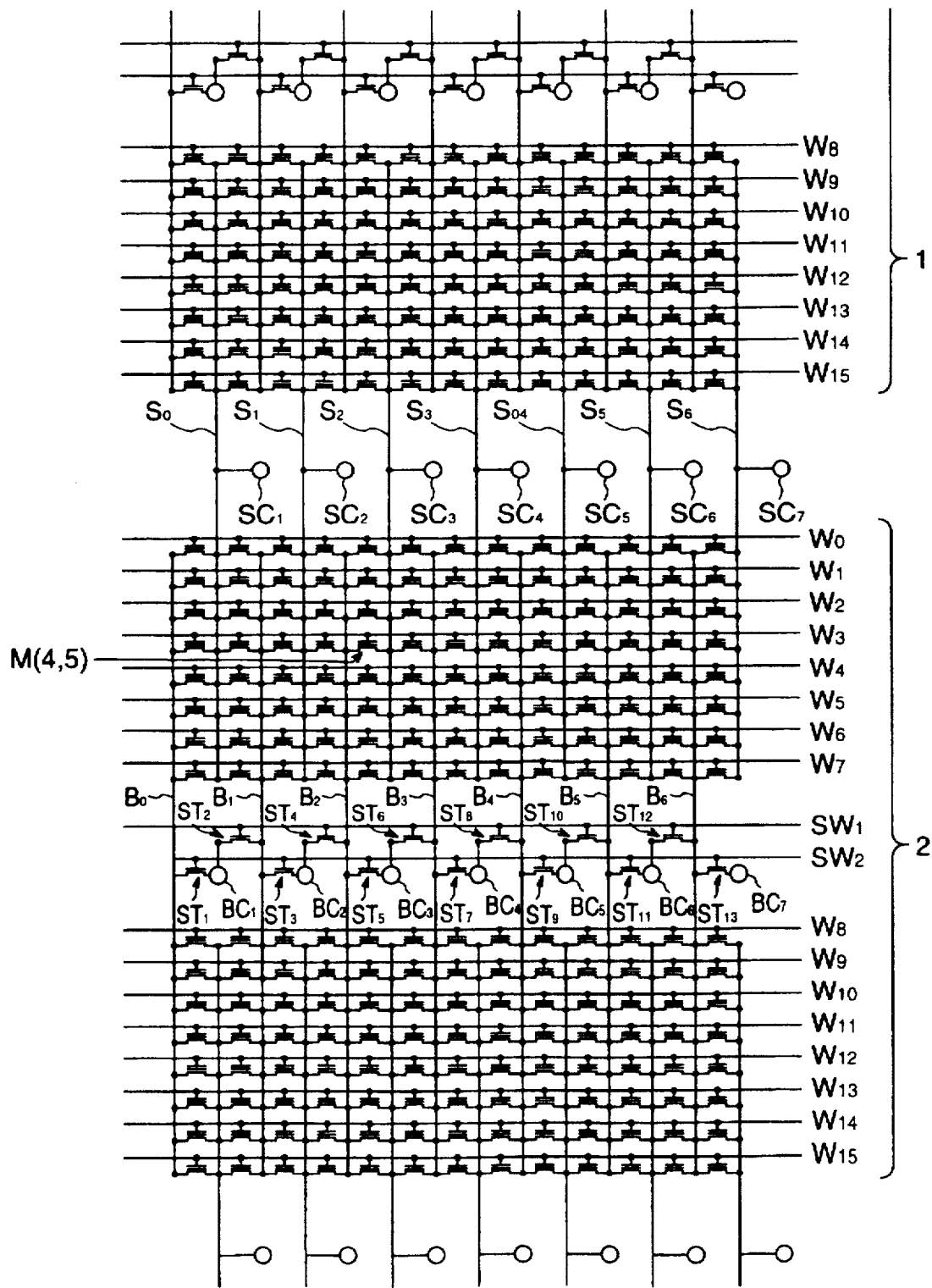
FIG. 7 is an equivalent electrical circuit diagram showing a structure of a memory cell array of a flash memory according to a second embodiment of the present invention.

FIG. 7 is a diagram showing an equivalent circuit of a part of a memory cell array of a flash memory. In FIG. 7, two memory cell blocks (only the lower half of the block 1 is shown on account of space consideration) are illustrated, and 16 in each column×13 in each row=208 memory cells are arranged in a matrix of columns and rows in each block, and connected in a NOR form. Each memory cell is represented by M(p,q) in general. Here, p represents an integer in a range of 1 to 16, and q represents an integer in a range of 1 to 13. In the memory cell array, a plurality of such blocks are arranged in the column and row directions. Each memory cell M(p,q) is a nonvolatile memory cell having a source and drain including a pair of spaced impurity diffusion layers formed in the surface of a semiconductor substrate, a floating gate formed on a semiconductor substrate at an area between the impurity diffusion layers through an insulating film, and a control gate formed on the floating gate through an insulating film.

Each of 16 word lines $W_0$ to $W_{15}$ is obtained by continuously forming the control gates of the memory cells M(p,q) disposed in one of the rows of each block. Further, each of the memory cells M(p,q) has its source or drain in common with the memory cell adjacent thereto in the row direction (the word line direction) in the figure. For example, a drain is common to both the memory cell M(4,5) and the memory cell M(4,4) on the left side thereof, and a source is common to both the memory cell M(4,5) and the memory cell M(4,6) on the right side thereof.

In each of the blocks 1 and 2, 16 word lines $W_0$ to $W_{15}$, seven sub-bit lines $B_0$ to $B_6$ and seven sub-source lines $S_0$ to $S_6$ are connected. The word lines $W_0$ to $W_{15}$ of each block are connected to the gates of 13 memory cells M(1,1) to M(1,13), M(2,1) to M(2,13), . . . , and M(16,1) to M(16,13), respectively. Further, the sub-bit lines $B_0$ to $B_6$ and the sub-source lines $S_0$ to $S_6$ are obtained by forming continuously the drain diffusion layers and the source diffusion layers of the memory cells arranged in a direction at a right angle with the word lines $W_0$ to $W_{15}$ (column direction, i.e., bit line direction), respectively.

The sub-bit lines $B_0$ to $B_6$, each being connected to the 16 memory cells M(1,q) to M(16,q) belonging to one block, are separated from those of another block so that the sub-bit lines of each block can be energized independently of the sub-bit lines of any other block. On the other hand, the sub-source lines $S_0$ to $S_6$, each provided for 16 memory cells disposed in a part of two adjacent blocks, i.e. 8 memory cells M(9,q)–M(16, q) in one of the two blocks and 8 memory cells M(1,q)–M(8,q) of the other block adjacent to the one block in the bit line direction, are separated from those, each provided for other 16 memory cells.

Further, through each of bit contacts $BC_1$ to $BC_6$ formed between the memory cell M(8,q) and the memory cell M(9,q), each of the main bit lines 1231 (FIG. 8), which are formed of a metal, such as aluminum, on the substrate with an insulating film (not shown) therebetween, is connected to the drains of a pair of bit selective transistors $ST_1$ and $ST_2$, $ST_3$ and $ST_4$, $ST_5$ and $ST_6$, $ST_7$ and $ST_8$, $ST_9$ and $ST_{10}$, or $ST_{11}$ and $ST_{12}$. Further, through a bit contact $BC_7$, a main bit line 1231 (FIG. 8) formed of a metal, such as aluminum, on the substrate with an interposed insulating film is connected to the drain of a selective transistor $ST_{13}$.

The sub-bit line $B_0-B_6$ the sub-bit line $B_1, \ldots,$ are connected to the sources of the bit selective transistors $ST_1$, $ST_3$, $ST_5$, $ST_7$, $ST_9$, $ST_{11}$ respectively, and $ST_{13}$, and a bit selective word line $SW_2$ extending in the word line direction is connected to the gates thereof. On the other hand, the sub-bit lines $B_1-B_6$ are connected to the sources of the bit selective transistors $ST_2$, $ST_4$, $ST_6$, $ST_8$, $ST_{10}$ and $ST_{12}$, respectively, and a bit selective word line $SW_1$ extending in the word line direction is connected to the gates thereof.

Source contacts $SC_1$ to $SC_7$ formed between the block 1 and the block 2 connect the sub-source lines $S_0$ to $S_6$ with the main source lines 1241 (FIG. 8) formed of a metal such as aluminum on the substrate with an interposed insulating film (not shown).

The distribution of contacts in the memory cell array becomes uniform by providing the bit contacts BC at the central positions of one block and the source contacts at portions between adjacent blocks as in the present embodiment, thus the integration density of the elements can be made higher.

Figure 8:
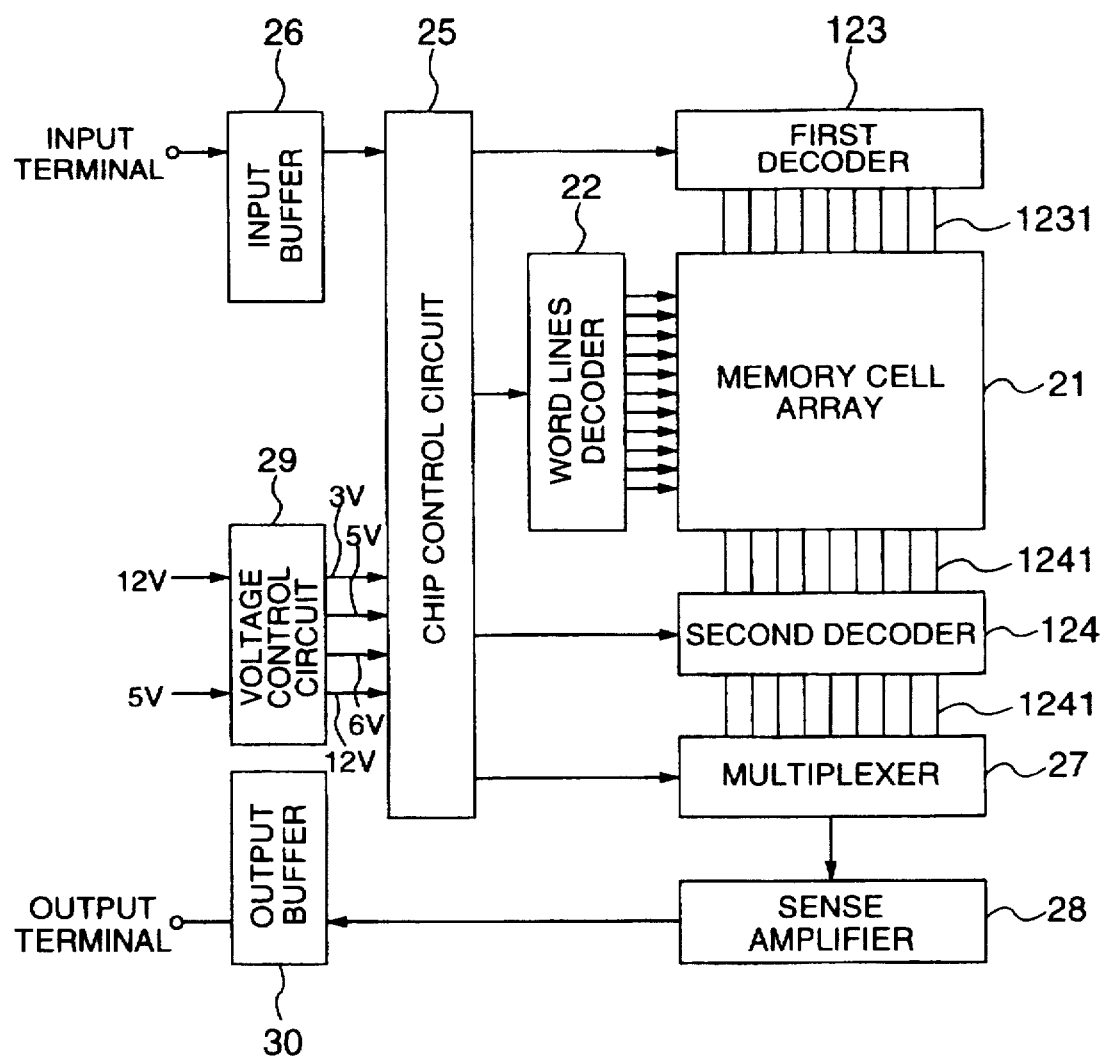
FIG. 8 is a block diagram showing a structure of the flash memory shown in FIG. 7.

FIG. 8 is a block diagram showing a circuit structure of a flash memory of the present invention. In FIG. 8, a memory cell array 21 has a plurality of memory cells arranged in a matrix as shown in FIG. 7. A word line decoder 122 is connected to word lines $W_0$ to $W_{15}$ and bit selective word lines $SW_1$ and $SW_2$ provided in each block of the memory cell array 21, respectively. A first decoder 123 and a second decoder 124, shown on opposite sides of the memory cell array 21, are connected to main bit lines 1231 and main source lines 1241 of the memory cell array 21, respectively. A chip control circuit 25 sends instructions for rewriting and reading of data to the word line decoder 122, the first decoder 123 and the second decoder 124, respectively, in accordance with the contents of an address signal sent from an input terminal IN through an input buffer circuit 26.

A voltage control circuit 29 is supplied with 12 V (voltage boosted from power supply voltage at 5 V) and 5 V (power supply voltage) from the outside, and generates voltages of 3 V and 6 V inside. The voltages of 3 V, 5 V, 6 V and 12 V are supplied to the word line decoder 122, the first decoder 123 and the second decoder 124, respectively, from the voltage control circuit 29 through the chip control circuit 25. Further, the word line decoder 122 supplies a voltage of 0 V, 5 V or 12 V, the first decoder 123 supplies a voltage of 0 V or 6 V and the second decoder 124 supplies a voltage of 0 V or 3 V to the control gates, drains and sources of respective memory cells, respectively, in accordance with the operation of rewriting or reading of data. A multiplexer 27 connected to the second decoder 124 selects any of the signals from the source lines in accordance with an instruction from the chip control circuit 25, and outputs the selected signal to a sense amplifier 28, the signal amplified in the sense amplifier 28 is outputted from an output terminal OUT through an output buffer circuit 30.

Figure 9:
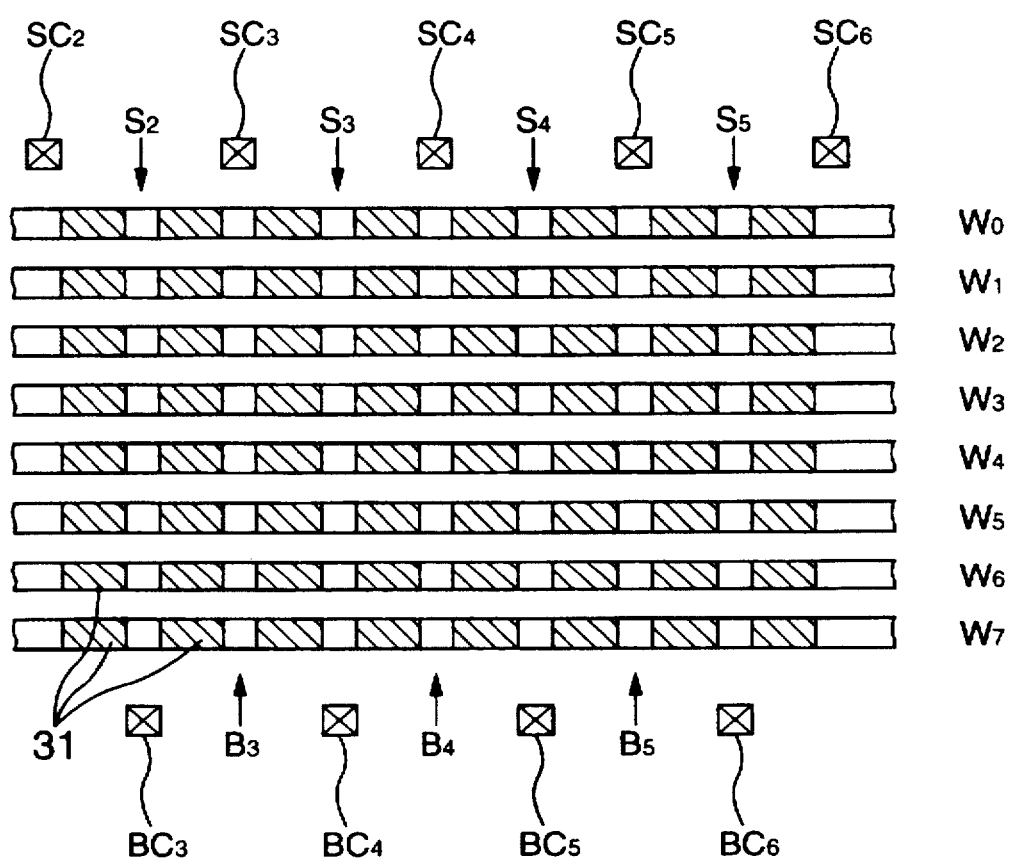
FIG. 9 is a plan view of the memory cell array shown in FIG. 7.

FIG. 9 is a partial plan view showing the outline of the memory cell array in the present embodiment. FIG. 9 shows 64 memory cells M(1,5) to M(1,12), M(2,5) to M(2,12), . . . , and M(8,5) to M(8,12) of the block 2 of the memory cell array shown in FIG. 7. The control gates of the memory cells M(1,5) to M(1,12), . . . , or M(8,5) to M(8,12) are integrally formed in one layer to provide the word line $W_0 \ldots,$ or $W_7$, and eight floating gates 31 are formed beneath each of the word lines $W_0, \ldots, W_7$ correspondingly to the respective memory cells. Further, the sub-bit lines $B_3$ to $B_5$ and the sub-source lines $S_0$ to $S_5$ extending in the direction at a right angle with the word lines are formed alternately at positions between every adjacent two floating gates 31 inside the silicon substrate. In the memory cell of the present embodiment, the minimum dimension of one memory cell in the word line direction is determined by the pitch of aluminum wirings, for instance, that serve as the main bit lines and the main source lines, which are connected to the sub-bit lines and the sub-source lines through the source contacts SC and the bit contacts BC. Also, the minimum dimension of one memory cell in the bit line direction is determined by the pitch of the word lines $W_0, \ldots, W_7$ serving as the control gates, thus making it possible to make the size of individual memory cell very small.

The memory cell of the flash memory of the present embodiment is manufactured basically by the same method as that for the flash memory of the first embodiment described with reference to FIGS. 4A to 4G.

Next, the writing operation of the flash memory shown in FIG. 7 will be described with reference to FIG. 12. For example, when data are written in a memory cell M(4,5) of the block 2, the word line $W_3$ of the block 2 is biased at 12 V, other word lines at 0 V, the main bit line connected to the bit contact $BC_3$ at 6 V, other main bit lines at 0 V, the main source line connected to the source contact $SC_2$ at 3 V, other main source lines at 0 V, the bit selective word line $SW_2$ of the block 2 at 5 V and other bit selective word lines at 0 V, respectively. Then, the bit selective transistors $ST_1$, $ST_3$, $ST_5$, $ST_7$, $ST_9$, $ST_{11}$ and $ST_{13}$ of the block 2 shown in FIG. 7 are turned ON, respectively, and potentials of the sub-bit lines $B_0$, $B_1$, $B_3$, $B_4$, $B_5$ and $B_6$ become 0 V and the potential of the sub-bit line $B_2$ becomes 6 V. Further, the potentials of the sub-source lines $S_0$, $S_2$, $S_3$, $S_4$, $S_5$ and $S_6$ become 0 V, and the potential of the sub-source line $S_1$ also becomes 3 V. As a result, 12 V is applied to the control gate of the memory cell M(4,5) of the block 2, 6 V to the drain thereof and 0 V to the source thereof, respectively. Hot electrons are injected into the floating gate of the memory cell M(4,5), and the memory cell M(4,5) is brought into a written state.

At this time, 6V is applied only to the sub-bit line $B_2$ of the block 2 and not to the sub-bit line $B_2$ of other blocks. Accordingly, the number of memory cells which have drains at 6 V is greatly reduced as compared with the first embodiment. Namely, the number of memory cells in which erroneous erasing may possibly occur during the writing operation is greatly reduced. Further, 6 V is applied to the drain of the memory cell M(4,4) and 3 V is applied to the source thereof, and 0 V is applied to the drain of the memory cell M(4,3) and 3 V is applied to the source thereof as shown in FIG. 7 by applying 3 V to the sub-source line $S_1$. Thus, erroneous writing rarely occurs as compared with a case when the source is in an open-circuit state as before. Also, the voltage applied to the sub-source line $S_1$ is not limited to 3 V and may be any value between 0 V and 6 V, which prevents hot electrons from being injected into the floating gate of any of the memory cell M(4,4) and the memory cell M(4,3).

Next, when data are written in a memory cell M(4,6) of the block 2 for instance, the word line $W_3$ of the block 2 shown in FIG. 7 is biased at 12 V, other word lines at 0 V, the main bit line connected to the bit contact $BC_3$ at 6 V, other main bit lines at 0 V, the main source line connected to the source contact $SC_4$ at 3 V, other main source lines at 0 V, the bit selective word line $SW_1$ of the block 2 at 5 V and other bit selective word lines at 0 V, respectively. Thus, the bit selective transistors $ST_2$, $ST_4$, $ST_6$, $ST_8$, $ST_{10}$ and $ST_{12}$ of the block 2 are turned ON, respectively, potentials of the sub-bit lines $B_0$, $B_1$, $B_2$, $B_4$, $B_5$ and $B_6$ become $_0$ V, respectively, and the potential of the sub-bit line $B_3$ becomes 6 V.

Further, potentials of the sub-source lines $S_0$, $S_1$, $S_2$, $S_4$, $S_5$ and $S_6$ become 0 V, respectively, and the potential of the sub-source line $S_3$ becomes 3 V at the same time. As a result, 12 V is applied to the control gate of the memory cell M(4,6) of the block 2, 6 V to the drain thereof and 0 V to the source thereof, respectively, hot electrons are injected into the floating gate of the memory cell M(4,6), and this memory cell M(4,6) is brought into a written state.

In this case, since 6 V is applied only to the drain of the memory cell connected to the sub-bit line $B_3$ of the block 2, similar to the case when data are written in the memory cell M(4,5), the number of memory cells of which the drains are at 6 V is greatly decreased when compared with the first embodiment. Further, when 3 V is applied to the sub-source line $S_3$, 6 V is applied to the drain of the memory cell M(4,7), 3 V is applied to the source thereof, 0 V is also applied to the drain of the memory cell M(4,8) and 3 V is applied to the source thereof. Thus, erroneous writing rarely occurs when compared with a case when the source is in an open-circuit state as before.

Next, the reading operation of the flash memory shown in FIG. 7 will be described. When data are read out of the memory cell M(4,5) of the block 2 for instance, the word line $W_3$ of the block 2 is biased at 5 V, other word lines at 0 V, the main bit line connected to the bit contact $BC_3$ at 3 V, other main bit lines at 0 V, all other main source lines at 0 V, the bit selective word line $SW_2$ of the block 2 at 5 V and other bit selective word lines at 0 V, respectively. Then, the bit selective transistors $ST_1$, $ST_3$, $ST_5$, $ST_7$, $ST_9$, $ST_{11}$ and $ST_{13}$ are turned ON, respectively, potentials of the sub-bit lines $B_0$, $B_1$, $B_3$, $B_4$, $B_5$ and $B_6$ become 0 V, and the potential of the sub-bit line $B_2$ becomes 3 V at the same time. Further, potentials of all the sub-source lines become 0 V. As a result, 5 V is applied to the control gate of the memory cell M(4,5) of the block 2, 3 V is applied to the drain thereof and 0 V is applied to the source thereof. At this time, whether the memory cell M(4,5) is in a written state or in an erased state is determined depending on whether an electric current flows through the main source line or not.

Next, the erasing operation of the flash memory shown in FIG. 7 will be described. In the present embodiment, storage contents of all the memory cells of the memory cell array are erased collectively. For this purpose, the word lines $W_0$ to $W_{15}$ of all blocks are biased at −12 V, all of the main bit lines at a floating state, all of the main source lines at 0 V and the bit selective word line $SW_2$ (or $SW_1$) of all blocks at 0 V. As a result, electrons are extracted from the floating gates of the memory cells in a written state by an FN tunnelling phenomenon, and data written in the memory cells are erased. Also, by biasing only a selected word line at −12 V, it is also possible to erase only the memory cells connected to that word line.

Figure 10:
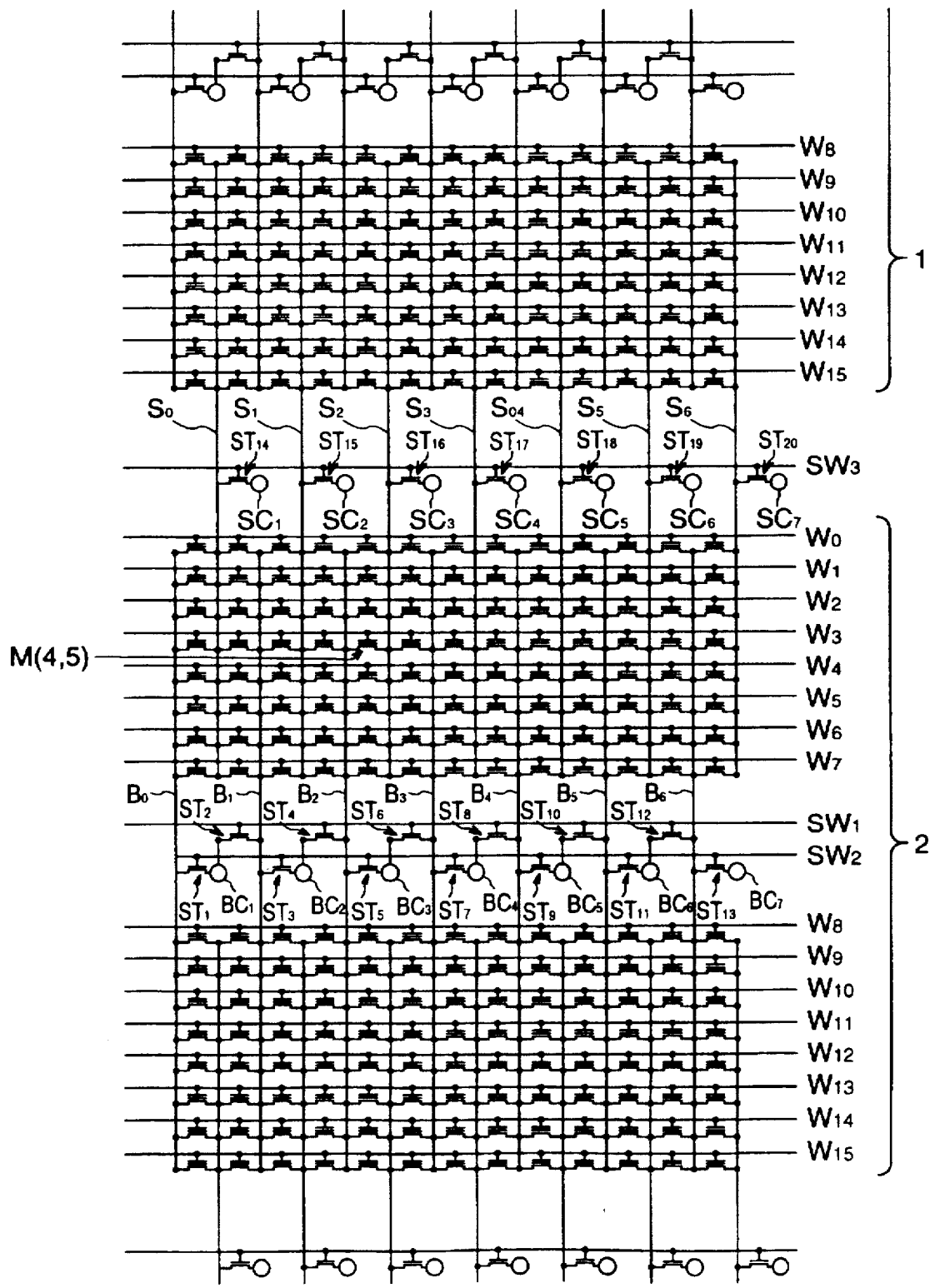
FIG. 10 is an equivalent circuit diagram showing a structure of a memory cell array of a flash memory according to a third embodiment of the present invention.

FIG. 10 shows a structure of a flash memory according to a third embodiment of the present invention. The same reference numerals are assigned to those parts that are common to FIG. 7. The embodiment shown in FIG. 10 is different from the embodiment shown in FIG. 7 only in that the sub-source lines $S_0$ to $S_6$ are connected to corresponding main source lines (not shown) through source contacts $SC_1$ to $SC_7$ and source selective transistors $ST_{14}$ to $ST_{20}$, respectively, and a source selective word line $SW_3$ provided in each block and extending in the word line direction is connected to the gates of source selective transistors $ST_{14}$ to $ST_{20}$. According to the present embodiment, when data are written in the memory cell M(4,5) of the block 2 for instance, it is possible to prevent erroneous erasing and erroneous writing of the memory cell similar to the case of the first embodiment, and it is also possible to apply 3 V only to the sub-source line $S_2$ formed extending over the blocks 1 and 2 by applying 5 V selectively to the source selective word line $SW_3$. Therefore, erroneous writing rarely occurs and higher reliability can be achieved. Further, the source selective word line $SW_3$ is connected to the word line decoder 122 shown in FIG. 8 in the present embodiment.

Figure 11:
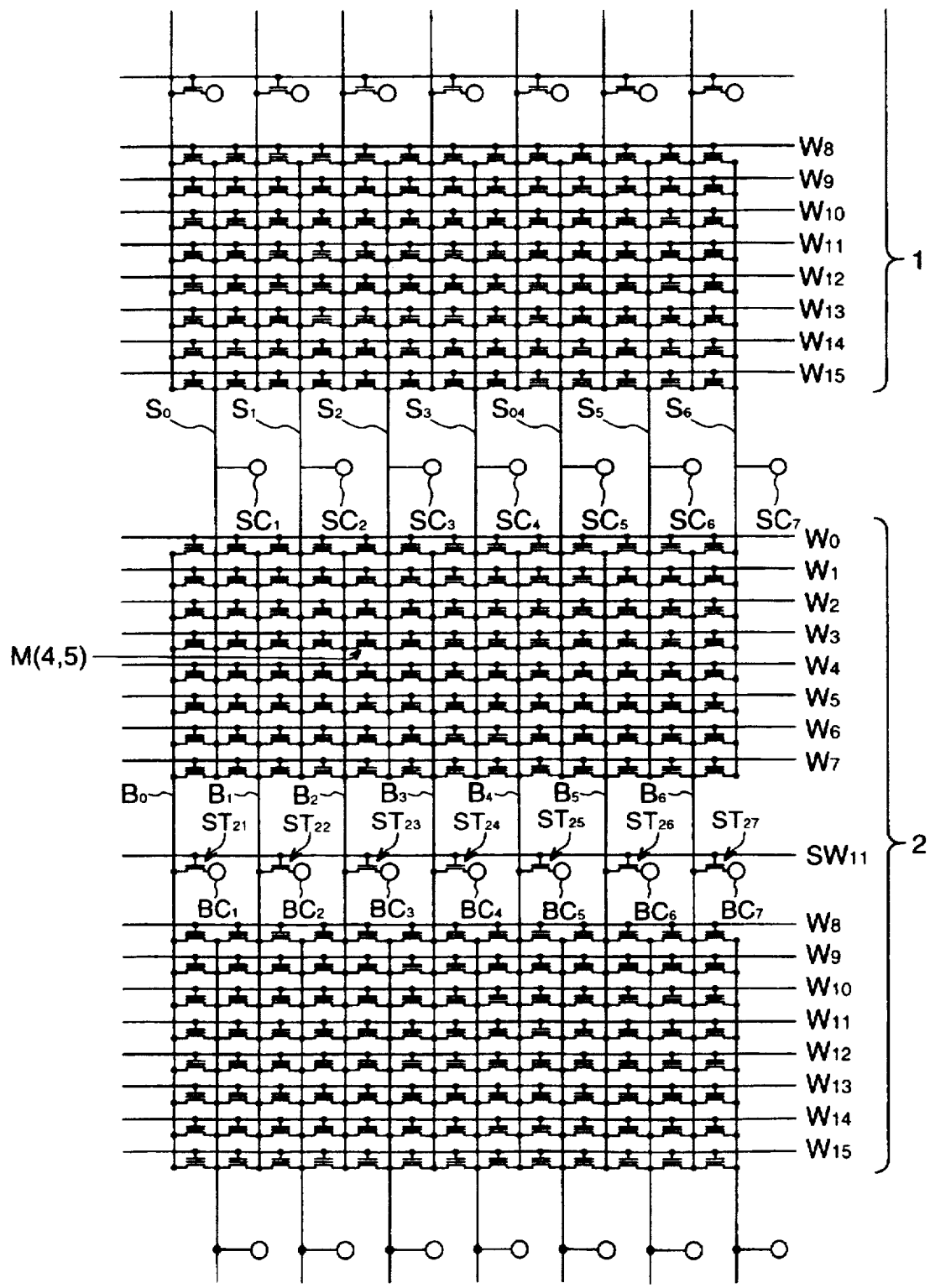
FIG. 11 is an equivalent circuit diagram showing a structure of a memory cell array of a flash memory according to a fourth embodiment of the present invention.

FIG. 11 shows a structure of a flash memory according to a fourth embodiment of the present invention. The same reference numerals are assigned to those parts common to FIG. 7. The embodiment shown in FIG. 11 is different from the embodiment shown in FIG. 7 only in that the sub-bit line $B_0$ is connected through a bit selective transistor $ST_{21}$ and a bit contact $BC_1$, a sub-bit line $B_1$ is connected through a bit selective transistor $ST_{22}$ and a bit contact $BC_2$, ..., and a sub-bit line $B_6$ is connected through a bit selective transistor $ST_{27}$ and a bit contact $BC_7$, respectively, to corresponding main bit lines 1231 (FIG. 8), and a bit selective word line $SW_{11}$ provided in each block and extending in the word line direction is connected to the gates of bit selective transistors $ST_{21}$ to $ST_{27}$. According to the present embodiment, when data are written in the memory cell M(4,5) of the block 2 for instance, it is possible to prevent erroneous erasing and erroneous writing of the memory cell, similar to the case of the second embodiment. Although there is a disadvantage that the combination of the main bit line and the sub-bit line cannot be changed, as compared with the structure of the second embodiment in which any of two sub-bit lines is selectively connected to one main bit line, and it is possible to decrease the bit selective word lines and the bit selective transistors. Therefore, the present embodiment is more suitable for high integration and the control thereof is simplified.

Another example of the rewriting operation of the flash memories in the second to the fourth embodiments of the present invention will be described with reference to FIG. 13.

Figure 12:
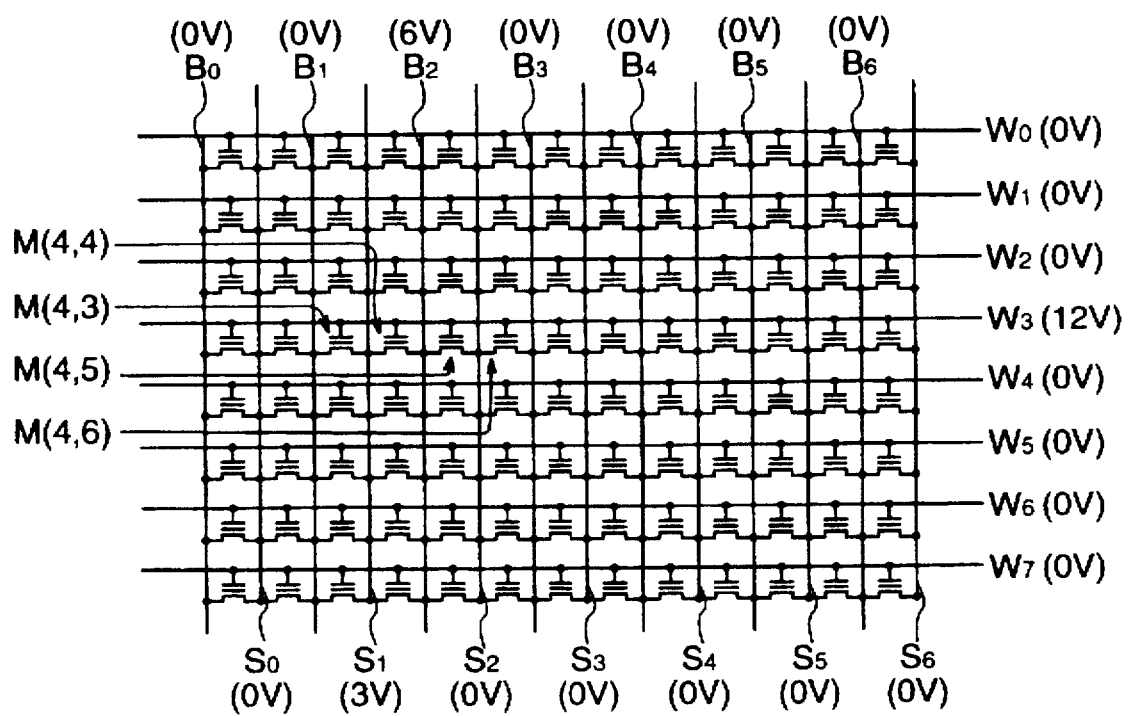
FIG. 12 is a diagram for explaining an example of the voltages applied to the memory cell array shown in FIG. 7 in a method of writing data according to the present invention.
Figure 13:
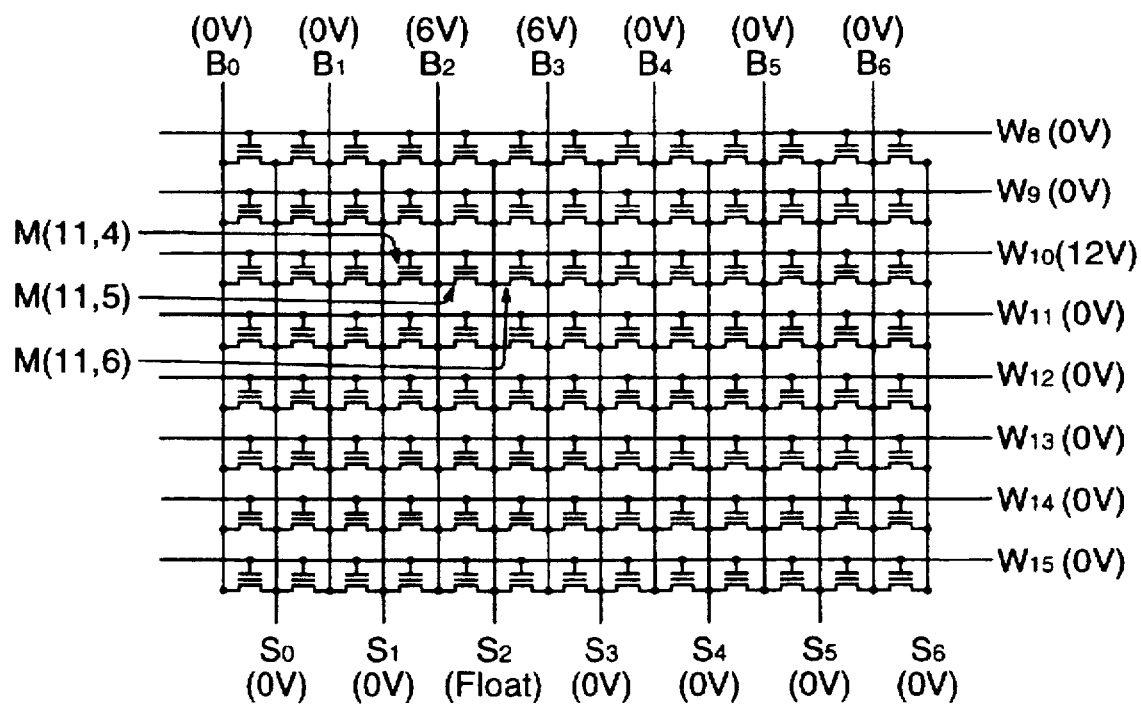
FIG. 13 is a diagram for explaining another example of the voltages applied to the memory cell array shown in FIGS. 7, 10 and 11 in a method of writing data according to the present invention.

FIG. 13 is an equivalent circuit diagram showing the lower side portion of the block 2 shown in FIG. 7, FIG. 11 or FIG. 12. Other structure is similar to that described in the second embodiment shown in FIG. 7, and the description of that structure is omitted here. Further, the voltage application will be described with respect to the memory cells as shown in FIG. 13 only, and the description of the voltages applied to the main bit line, the main source line and the selective word line is omitted for the purpose of simplifying the description.

In FIG. 13, when data are written in a memory cell M(11,4) for instance, the word line $W_{10}$ is biased at 12 V, other word lines at 0 V, the sub-bit line $B_2$ at 6 V, other sub-bit lines at 0 V, the sub-source line $S_2$ at a floating state and other sub-source lines at 0 V, respectively. As a result, 12 V is applied to the control gate of the memory cell M(11,4), 6 V to the drain thereof and 0 V to the source thereof, so that hot electrons are injected into the floating gate of the memory cell M(11,4), and this memory cell M(11,4) is brought into a written state. Further, it is possible to prevent writing in a memory cell M(11,5) by placing the sub-source line $S_2$ at a floating state.

In the present embodiment, a memory cell M(11,6) has 12 V applied to its control gate, and 0 V to the drain, and the source thereof is at a floating state. However, since the potential of the sub-source line $S_2$, which is at an open-circuit state, is controlled through the adjacent memory cell M(11,5), erroneous writing does not occur, unlike the prior art.

For the operation described above, the circuit shown in FIG. 8 is used, but the second decoder 124 is arranged to apply a voltage of 0 V to the sources of respective memory cells or place them at a floating state (an open-circuit state) in accordance with the respective operations of rewriting or reading of data.

Next, another example of the rewriting operation of the second to the fourth embodiments will be described with reference to FIG. 14.

Figure 14:
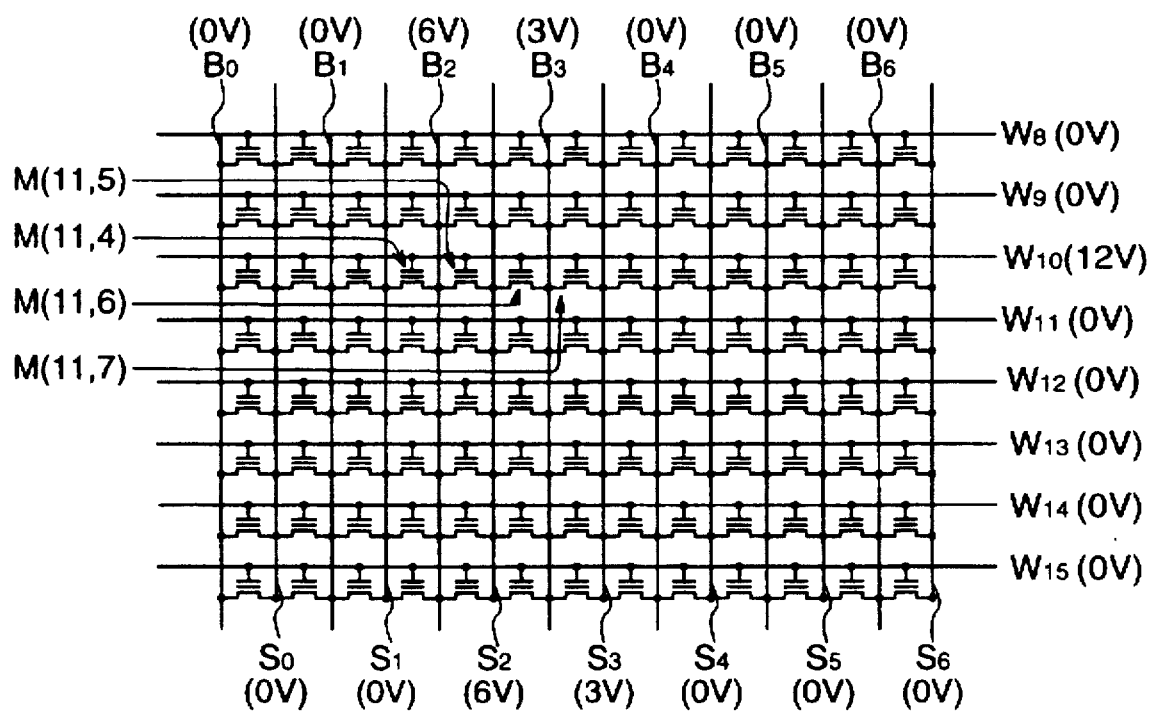
FIG. 14 is a diagram for explaining still another example of the voltages applied to the memory cell array shown in FIGS. 7, 10 and 11 in a method of writing data according to the present invention.
Figure 15:
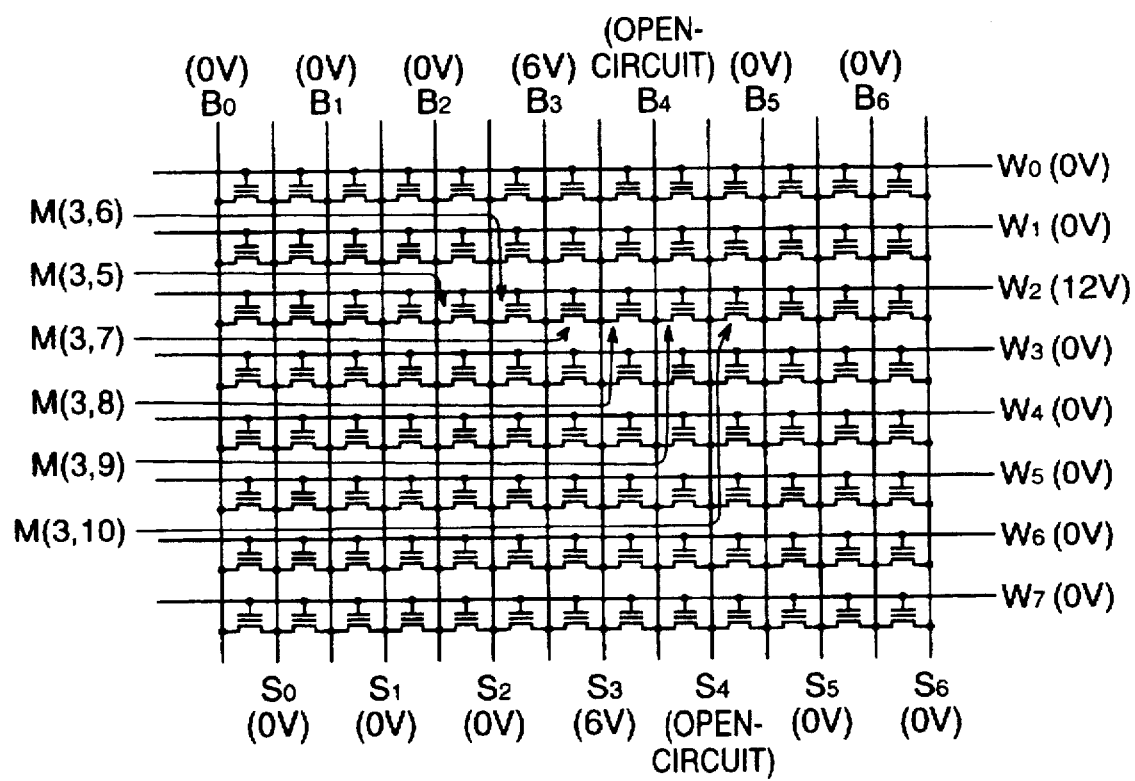
FIG. 15 is a diagram for explaining a conventional method of writing data in a flash memory.

FIG. 14 is an equivalent circuit diagram showing the lower side portion of the block 2 shown in FIG. 7, FIG. 11 or FIG. 12. Other structure is similar to that described in the second embodiment shown in FIG. 7, and the description of that structure thereof is omitted here. Further, the voltage application will be described with respect to only the memory cells as shown in FIG. 14, and the description of the voltages applied to the main bit line, the main source line and the selective word line is omitted in this explanation for the purpose of simplifying the description.

In FIG. 14, when data are written in the memory cell M(11,4) for instance, the word line $W_{10}$ is biased at 12 V, other word lines at 0 V, the sub-bit line $B_2$ at 6 V, the sub-bit line $B_3$ at 3 V, other sub-bit lines at 0 V, the sub-source line $S_2$ at 6 V, the sub-source line $S_3$ at 3 V and other sub-source lines at 0 V, respectively. As a result, 12 V is applied to the control gate of the memory cell M(11,4), 6 V to the drain thereof and 0 V to the source thereof, respectively, hot electrons are injected into the floating gate of the memory cell M(11,4), and this memory cell M(11,4) is brought into a written state. At this time, erroneous writing in the memory cell M(11,5) is prevented by applying 6 V to the sub-source line $S_2$, erroneous writing in the memory cell M(11,6) is prevented by applying 3 V to the sub-bit line $B_3$, and furthermore, erroneous writing in the memory cell M(11,7) is prevented by applying 3 V to the sub-source line $S_3$.

In the respective embodiments described above, writing is performed by injection of hot electrons from the drain, but it is also possible to perform writing by injection of hot electrons from the source.

According to the present invention, it is possible to realize a highly reliable nonvolatile semiconductor memory device, such as a flash memory of the virtual ground system, with a very low possibility of erroneous erasing and erroneous writing of other memory cells at time of writing operation while maintaining a high integration of the elements and a method of writing in the same.

I claim:

1. A nonvolatile semiconductor memory device comprising:

a semiconductor substrate;

an array of a plurality of memory cells formed on said semiconductor substrate and arranged in a matrix of columns and rows, each memory cell having a source, a drain and a composite gate structure including a floating gate and a control gate, wherein adjacent two memory cells arranged in each row have a common impurity diffusion layer which serves as the source or drain of each of the two memory cells and said memory cell array is divided into a plurality of blocks in a direction of the column so that 2n (n is a positive integer) memory cells are included in one of the column in each of the blocks;

word lines, each being formed to include the control gates of the memory cells arranged in one of the rows;

a plurality of sub-bit lines provided in each of the blocks, wherein each of the sub-bit lines includes one continuous layer formed in said substrate and impurity diffusion layers serving as the drains of the memory cells arranged in a direction of the column of the block are connected continuously through the continuous layer;

a plurality of sub-source lines formed so as to extend over adjacent two of the blocks, wherein each of the sub-source lines includes one continuous layer formed in said substrate and impurity diffusion layers serving as the sources of said 2n memory cells arranged in the column direction in said two blocks are connected continuously by the continuous layer and said plurality of sub-bit lines and said plurality of sub-source lines are arranged alternately in the block;

a plurality of main bit lines formed along the columns, respectively; and switching means for connecting each of said plurality of sub-bit lines provided in each block to at least one of said plurality of main bit lines through a bit contact formed in said block.

2. A nonvolatile semiconductor memory device according to claim 1, further including means for controlling conductivity of said switching means.

3. A nonvolatile semiconductor memory device according to claim 1, wherein said switching means includes means for connecting each of said plurality of sub-bit lines selectively to any one of adjacent two of the main bit lines.

4. A nonvolatile semiconductor memory device according to claim 3, wherein said switching means includes a first selective transistor for connecting each of said plurality of sub-bit lines to one of the adjacent two main bit lines and a second selective transistor for connecting the same to the other of the two main bit lines.

5. A nonvolatile semiconductor memory device according to claim 4, further including means for controlling conductivities of said first selective transistor and said second selective transistor.

6. A nonvolatile semiconductor memory device according to claim 1, further including:

a plurality of main source lines formed along the columns, respectively, and arranged alternately with said plurality of main bit lines; and means for connecting each of said plurality of sub-source lines to one of said main source lines through a source contact provided between the associated two blocks.

7. A nonvolatile semiconductor memory device according to claim 6, further comprising second switching means for controlling the connection between each of said plurality of sub-source lines and one of said main source lines.

8. A nonvolatile semiconductor memory device according to claim 7, wherein said second switching means includes a plurality of transistors connected between each of said plurality of sub-source lines and one of said main source lines.

9. A nonvolatile semiconductor memory device according to claim 3, further including:

a plurality of main source lines formed along the columns, respectively, and arranged alternately with said plurality of main bit lines; and means for connecting each of said plurality of sub-source lines to one of said main source lines through a source contact provided between the adjacent two blocks.

10. A nonvolatile semiconductor memory device according to claim 9, further comprising second switching means for controlling the connection between each of said plurality of sub-source lines and one of said main source lines.

11. A nonvolatile semiconductor memory device according to claim 10, wherein said second switching means includes a plurality of transistors connected between each of said plurality of sub-source lines and one of said main source lines.

12. A method of writing data in a nonvolatile semiconductor memory device, in which said nonvolatile semiconductor memory device includes an array of a plurality of memory cells formed in a semiconductor substrate and disposed in a matrix of columns and rows, each memory cell having a source, a drain and a composite gate construction including a floating gate and a control gate, in which adjacent two memory cells arranged in each row have a common impurity diffusion layer serving as the sources or drains of said two memory cells; word lines, each being formed to include the control gates of the memory cells arranged in each row; and a plurality of bit lines and a plurality of source lines disposed alternately in the row direction, each bit line including a continuous layer formed in said substrate, through which the impurity diffusion layers serving as the drains of the memory cells arranged in one column are continuously connected, each source line including a continuous layer formed in said substrate, through which the impurity diffusion layers serving as sources of the memory cells arranged in one column are continuously connected, said method comprising the steps of:

applying a first voltage to the control gate of a first memory cell to be written, a second voltage to the drain thereof and a third voltage lower than the second voltage to the source thereof, thereby injecting hot carriers into the floating gate of said first memory cell;

applying said second voltage to a source of a second memory cell having the drain in common with said first memory cell; and applying a fourth voltage lower than said second voltage and higher than said third voltage to the drain of a third memory cell having its source in common with said second memory cell and to the source of a fourth memory cell having its drain in common with said third memory cell.

13. A method of writing data in a nonvolatile semiconductor memory device according to claim 12, wherein said first, second, third and fourth voltages are 12 V, 6 V, 0 V and 3 V, respectively.

14. A method of writing data in a nonvolatile semiconductor memory device, in which said nonvolatile semiconductor memory device includes an array of a plurality of memory cells formed in a semiconductor substrate and disposed in a matrix of columns and rows, each memory cell having a source, a drain and a composite gate construction including a floating gate and a control gate, wherein adjacent two of the memory cells arranged in each row have a common impurity diffusion layer which serves as the sources or drains of the two memory cells; word lines, each being formed to include the control gates of the memory cells arranged in one of the rows; and a plurality of bit lines and a plurality of source lines disposed alternately in the row direction, each bit line including a continuous layer formed in said substrate, through which the impurity diffusion layers serving as the drains of the memory cells arranged in one column are continuously connected, each source line including a continuous layer formed in said substrate, through which the impurity diffusion layers serving as the sources of the memory cells arranged in one column are continuously connected, said method comprising the steps of:

applying a first voltage to the control gate of a first memory cell to be written, a second voltage to the drain thereof and a third voltage lower than the second voltage to the source thereof, thereby injecting hot carriers into the floating gate of said first memory cell; and applying a fourth voltage higher than said third voltage and lower than said second voltage to the source of a second memory cell having its drain in common with said first memory cell.

15. A method of writing data in a nonvolatile semiconductor memory device according to claim 14, wherein said first, second, third and fourth voltages are 12 V, 6 V, 0 V and 3 V, respectively.

* * * * *